(12) United States Patent
Jiang et al.

(10) Patent No.: US 6,385,224 B1
(45) Date of Patent: May 7, 2002

(54) REGROWN NOTCH LASER

(75) Inventors: Ching-Long Jiang, Belle Mead; Randall Brian Wilson, Maplewood; Mark Rafael Soler, Whippany, all of NJ (US)

(73) Assignee: The Whitaker Corporation, Wilimington, DE (US)

( * ) Notice: Subject to any disclaimer, the term of this patent is extended or adjusted under 35 U.S.C. 154(b) by 0 days.

(21) Appl. No.: 09/277,908

(22) Filed: Mar. 29, 1999

(51) Int. Cl.$^7$ ................................................. H01S 5/22
(52) U.S. Cl. ........................................................ 372/46
(58) Field of Search ............................ 372/36, 109, 45, 372/46

(56) References Cited

U.S. PATENT DOCUMENTS 5,881,193 A * 3/1999 Anigbo et al. ................ 385/93

* cited by examiner

Primary Examiner—James W. Davie

(57) ABSTRACT

An edge emitting laser comprising a substrate with or without a buffer layer having a central mesa disposed thereon, said central mesa having a bottom surface, a top surface and side surfaces and said mesa having an active layer disposed on said substrate with or without a buffer layer, a cladding layer disposed on said active layer, and a quaternary layer disposed on said cladding layer; first and second blocking layers disposed along said sides of said mesa; and at least one alignment fiducial disposed along an outer region of the laser, said alignment fiducial comprising at least a first surface and a second surface, said first surface being a certain distance from said active layer in the y-direction and said second surface being a certain distance from said active layer in the x-direction, said first surface comprising at least a portion of the top of said quaternary layer, said second surface comprising at least a portion of a side of at least one of said quaternary, cladding, or active layers.

12 Claims, 15 Drawing Sheets

REGROWN NOTCH LASER

FIELD OF THE INVENTION

The present invention relates to alignment notches in a buried heterostructure edge emitting laser for alignment of the device in a passive manner.

BACKGROUND OF THE INVENTION

The present invention is related to U.S. patent application Ser. No. 09/031,586 to Imhoff, filed Feb. 27, 1998 now U.S. Pat. No. 5,981,975 as well as to U.S. patent application Ser. No. 60/079,909 filed on Mar. 30, 1998, the disclosures of which are specifically incorporated herein by reference. Light emitting devices often utilize double heterostructures or multi-quantum well structures in which an active region of a III-V semiconductor is sandwiched between two oppositely doped III-IV compounds. By choosing appropriate materials for the outer layers, the band gaps are made to be larger than that of the active layer. This procedure, well known to one of ordinary skill in the art, produces a device that permits light emission due to recombination in the active region, but prevents the flow of electrons or holes between the active layer and the higher band gap sandwiching layers due to the differences between the conduction band energies and the valence band energies, respectively. Light emitting devices can be fabricated to emit from the edge of the active layer, or from the surface. Typically, a first layer of material, the substrate, is n-type indium phosphide (InP) with an n-type buffer layer disposed thereon. This buffer layer again is preferably InP. The active layer is typically indium gallium arsenide phosphide (InGaAsP) with a p-type cladding layer of InP disposed thereon. One potential pitfall of double heterostructure lasers is often a lack of means for confining the current and the radiation emission in the lateral direction. The result is that a typical broad area laser can support more than one transverse mode, resulting in unacceptable mode hopping as well as spacial and temperature instabilities. To overcome these problems, modern semiconductor lasers employ some form of transverse optical and carrier confinement. A typical structure to effect lateral confinement is the buried heterostructure laser. The buffer, active and cladding layers are disposed on the substrate by epitaxial techniques. The structure is then etched through a mask down to the substrate level leaving a relatively narrow (roughly on the order of several microns) rectangular mesa composed of the original layers. A burying layer is then regrown on either side of the mesa resulting in the buried heterostructure device. The important feature of a buried heterostructure laser is that the active layer is surrounded on all sides by a lower index material so that from an electromagnetic perspective the structure is that of a rectangular dielectric waveguide. The lateral and transverse dimensions of the active region and the index discontinuities are chosen so that only the lowest order transverse mode can propagate in the waveguide. Another very important feature of the structure and that which is required to effect lasing is the confinement of injected carriers at the boundaries of the active region due to the energy band discontinuities at the interface of the active region and the InP layers. These act as potential barriers inhibiting carrier escape out of the active region.

One area of optoelectronics which has seen a great deal of activity in the recent past is in the area of passive alignment. Silicon waferboard, which utilizes the crystalline properties of silicon for aligning optical fibers, as well as passive and active optical devices, has gained a great deal of acceptance. One technique for aligning an optoelectronic device to an optical fiber and other passive and/or active elements is the use of an alignment pedestal for lateral planar registration and standoffs for height registration. By virtue of the sub-micron accuracy of photolithography used to define and align these pedestals and standoff features, the application of this approach has proven to be a viable alignment alternative. By effecting alignment in a passive manner, the labor input into the finished product can be reduced, resulting in lower cost of the final product. One example of such an alignment scheme can be found in U.S. Pat. No. 5,163,108 to Armiento, et al., the disclosure of which is specifically incorporated herein by reference. The reference to Armiento, et al. makes use of an alignment notch on the active device which is designed to mate with alignment pedestals and standoffs on the silicon waferboard. This particular structure is used for aligning an optical fiber array to an array of light emitting devices.

Unfortunately, one problem with structures like the one shown in the reference to Armiento, et al., is that the alignment notch in the laser structure is limited to a ridge laser structure. This is because in a ridge waveguide laser structure, the patterning photolithography step which defines the active waveguide is simultaneously used to define the alignment notch in the same mask level, resulting in a alignment of the notch and active waveguide which is limited to a ridge laser structure. However, it is advantageous from a performance standpoint, to be able to utilize lasers and other active devices which incorporate a regrowth step, as described above. For this class of devices, the subsequent regrowth step(s), which bury the active waveguide mesa and notch create a more complicating fabrication sequences. The fabrication of an alignment notch after the regrowth is needed since the notch pattering step must occur in a photolithography step that defined the notch and the active at the same time. Moreover, a notch pattering step on the regrown surface of the wafer is difficult because the mesa is not a visible re-alignment feature using the conventional technique of optical alignment methods. Accordingly, what is needed is a technique for effecting an alignment fiducial, such as a notch, in a buried double heterostructure laser or other buried heterostructure device which is accurately aligned to the optical axis of the emitted light beam.

SUMMARY OF THE INVENTION

The present invention relates to a buried heterostructure laser with a novel alignment notch on either side of the laser die, with the notch formed by a quaternary (Q) layer of InGaAsP which is used to effect alignment of the die in a passive manner on silicon waferboard. The Q layer on the side mesa is an etch stop layer and effects alignment as the notch has a side surface for alignment against a pedestal (x-direction alignment in FIG. 2) and a top surface of the Q etch stop layer effects alignment against a standoff (y-direction in FIG. 2).

DETAILED DESCRIPTION OF THE INVENTION

Figure 1:
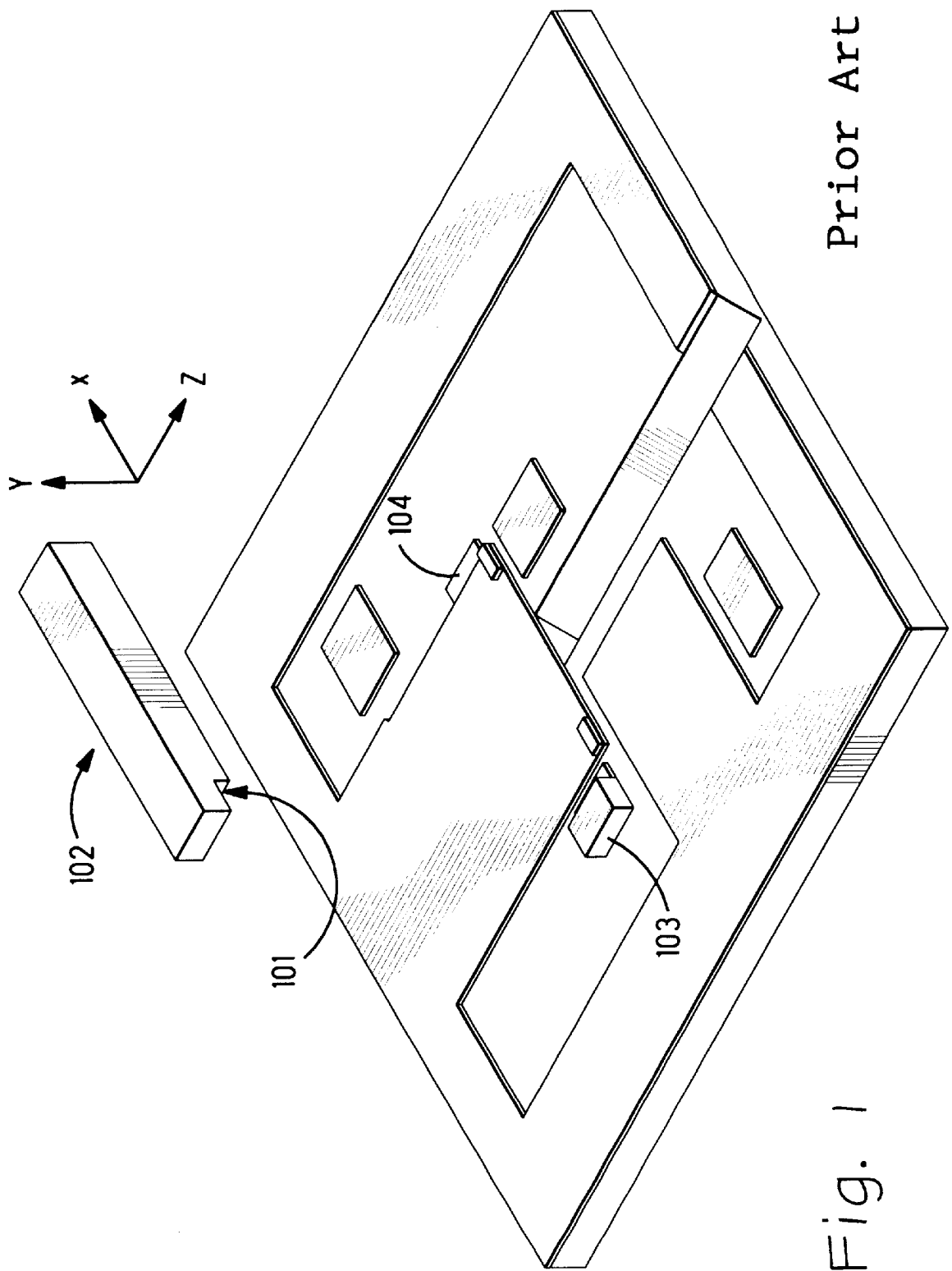
FIG. 1 is a perspective view of a prior art structure of a notch in laser die with fiducials on the substrate of the silicon waferboard.
Figure 2:
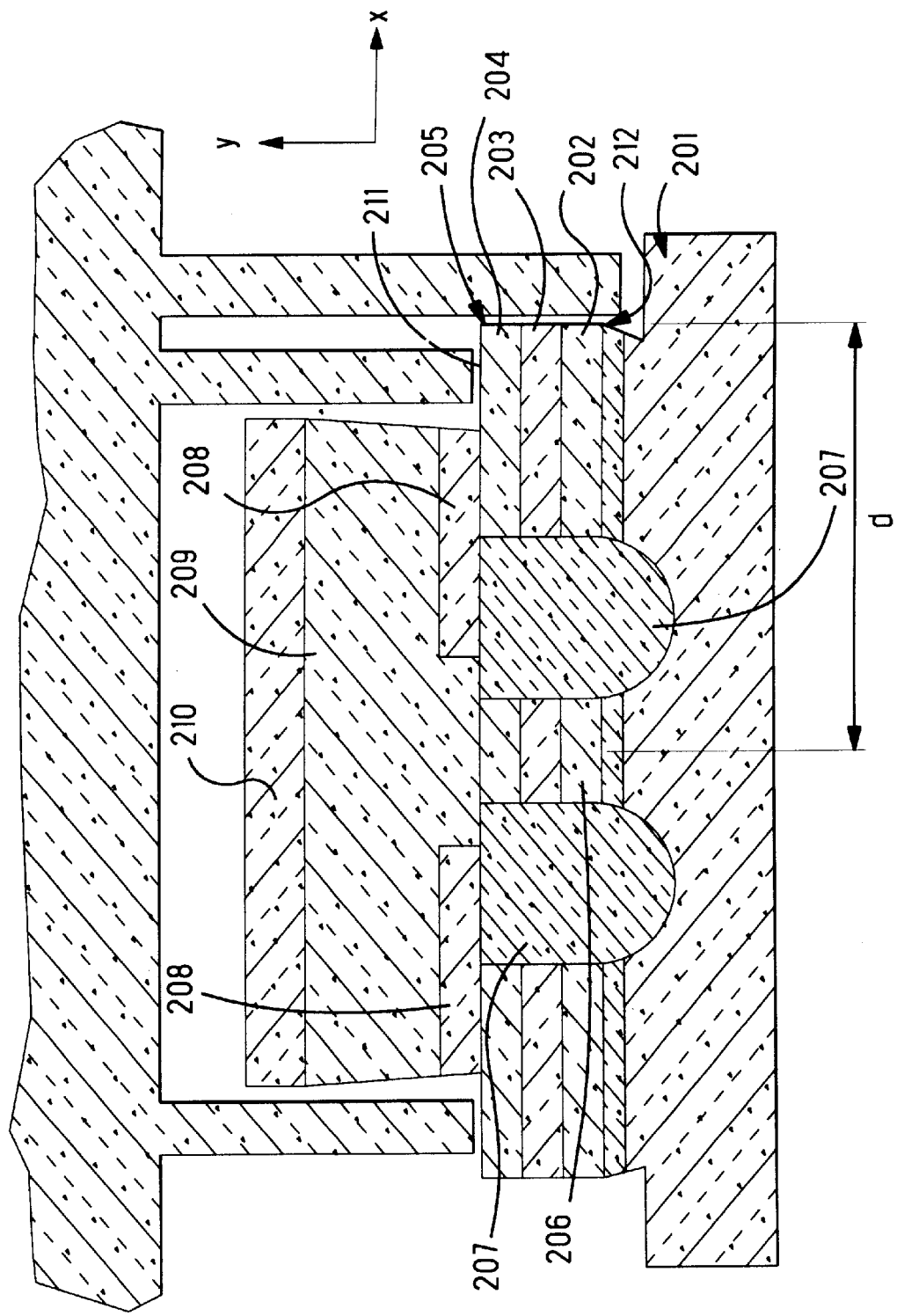
FIG. 2 is a cross-sectional view of the invention of the present disclosure showing the alignment fiducials on the silicon waferboard making contact with the device to effect the passive alignment by way of the alignment notch of the present invention.

Turning to FIG. 2, the final product is shown in cross-section with the silicon pedestals and standoffs in alignment with the device. To this end, n-type InP substrate 201 has an active layer 202, a cladding layer 203 and an etch stop alignment layer 204. An alignment notch 205 is also shown. The mesa structure is shown generally at 206 with the InP blocking layers, which bury the mesa laterally, shown at 207 as well as blocking layers 208 which provide for current confinement so that current is prohibited from going between the mesa and the side Q-active layer. A p-type burying layer is shown at 209 with the p-type contact layer at 210. The standoff registers the etch stop alignment layer at a top surface 211 for registration in the y-direction (reference the coordinate axis shown). A second surface or a side surface 212 effects the alignment to a pedestal for registration in the x-direction. To be very clear, there are two surfaces which are used for alignment. The first surface is for height registration to a standoff, and is shown at 211. A second surface is shown at 212 for registration in the x-direction. Both the height registration (y-axis in FIG. 2) as well as the side registration to a pedestal (x axis in FIG. 2) are effected very precisely by the invention of the present disclosure. To this end, the distance from the center of the mesa to the side surface 212 is toleranced very tightly through the precision of photolithographic alignment and etching techniques. This is shown as a distance d in FIG. 2. Furthermore, the height registration which accurately aligns the active layer 206, where light emission occurs, to an optical fiber in the y-direction in FIG. 2 is tightly controlled by the thickness between the active layer and the top of the etch stop alignment layer 204.

It is of particular importance to note that the etch stop alignment layer in the present invention, through the use of selective etching, allows for the precision in the x-direction and through precision growth techniques allows for the precision alignment in the y-direction. The present invention through the etch stop alignment layer 204 enables the preservation of the location of the notch relative to the active mesa after regrowth of the InP blocking and burying layers.

Figure 3:
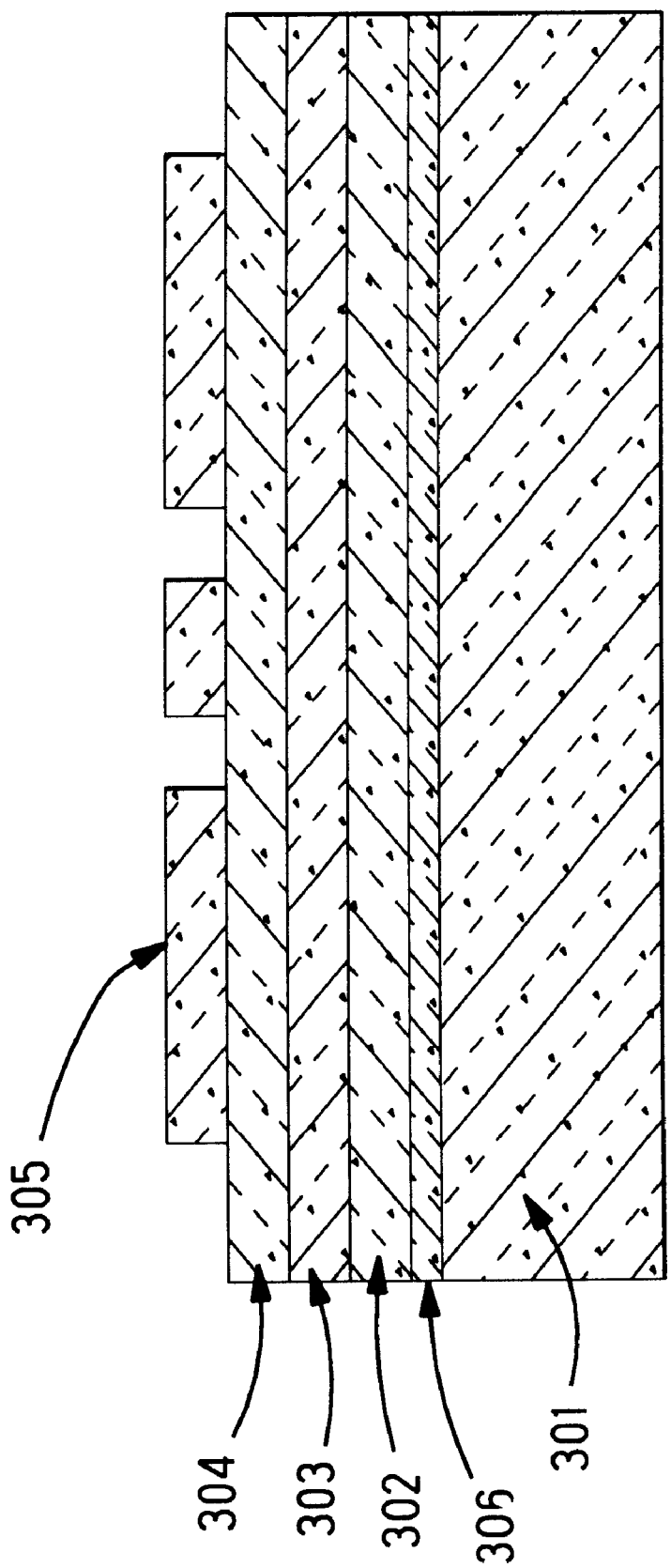
FIGS. 3–11 are cross sectional views of the various steps in effecting the fabrication of the invention of the present disclosure.
Figure 4:
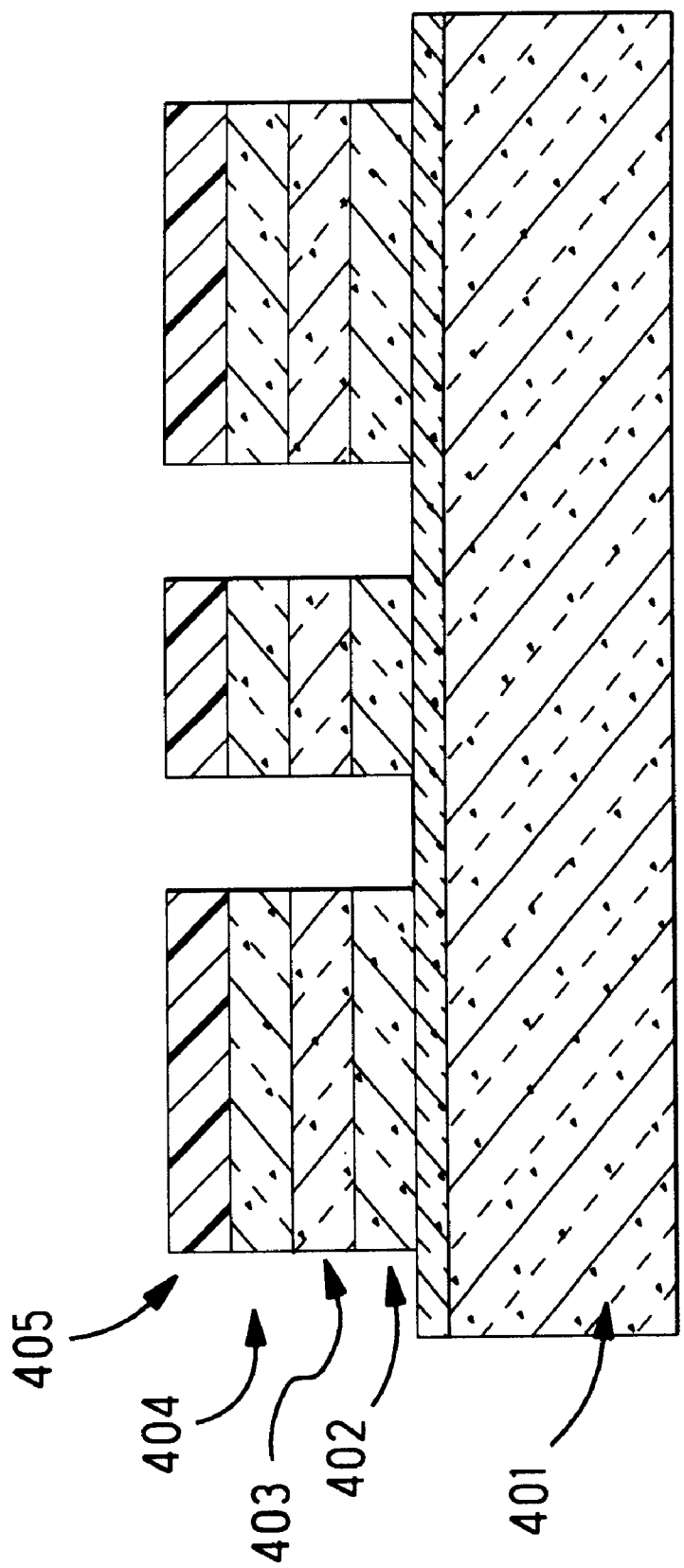
Figure 5:
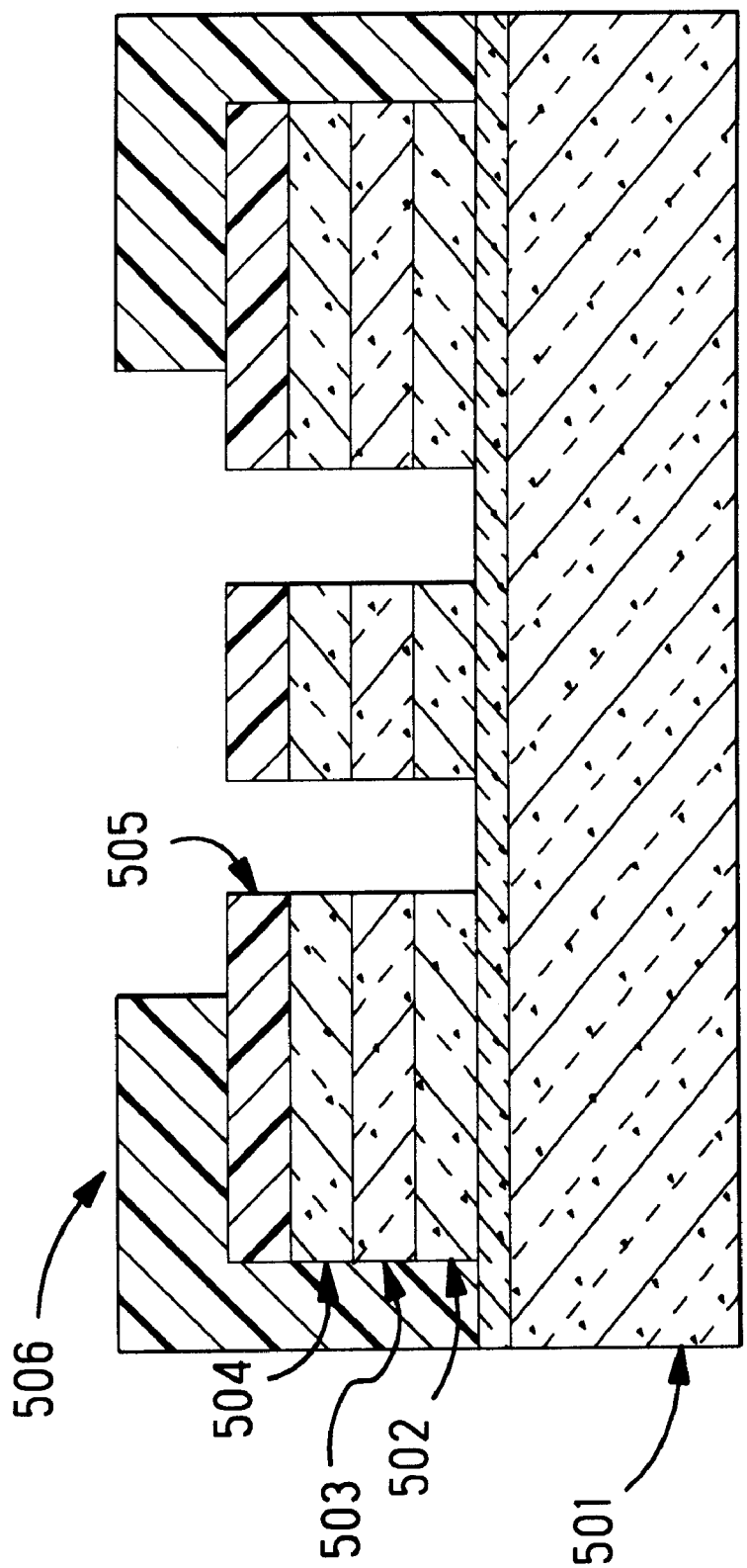
Figure 6:
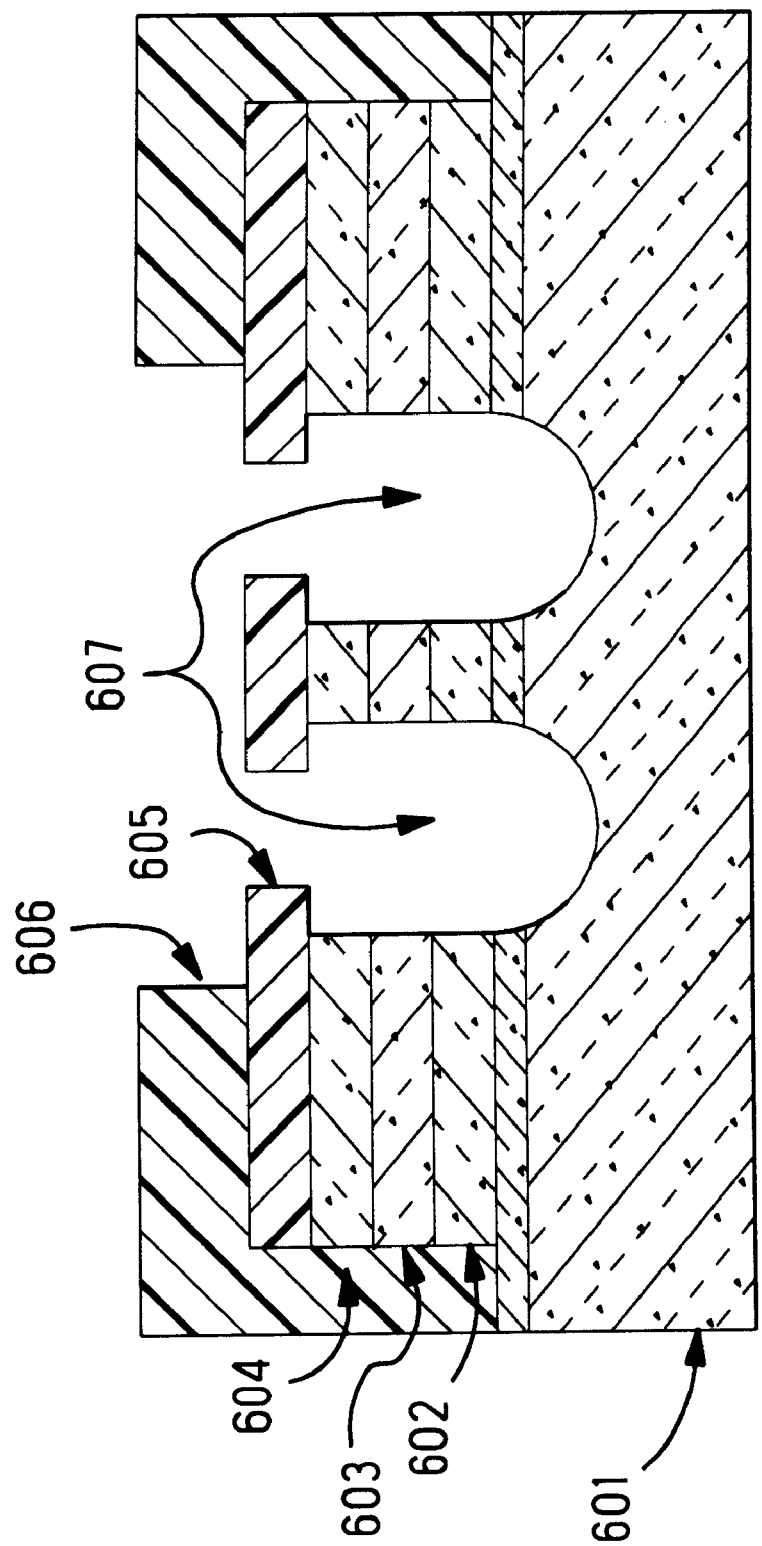

As stated previously, the fabrication is as disclosed in FIGS. 3–15 with various embodiments disclosed. Turning to FIG. 3, the InP substrate 301, has disposed thereon an InP buffer layer 306, an InGaAsP bulk or multiple quantum well (MQW) active layer 302, an InP cladding layer 303, and a thin InGaAsP etch-stop alignment layer 304. A dielectric layer 305 such as $SiO_2$ or $Si_3N_4$ is deposited over the wafer using standard technique. A photolithography patterning step, using conventional techniques is used to define openings in the $SiO_2$ or $Si_3N_4$ etching mask corresponding to the alignment notch edge and the laser waveguide mesa. Turning to FIG. 4, a reactive ion or other suitable etching technique is then used to etch through the InGaAsP etch-stop alignment layer 404, the InP cladding layer 403, and the active layer 402 of the underlying structure. Turning to FIG. 5, photoresist 506 is next applied and patterned such that the region of the vicinity of the alignment notch is protected with photoresist, while the active mesa region is exposed for a subsequent etching step to further define the active mesa as seen in FIG. 6. After the final mesa etching step, which utilizes an etchant which does not attack photoresist, the remaining photoresist is removed, leaving a structure which now incorporates a precisely located InGaAsP etch-stop alignment layer upon which additional InP regrowths may be performed using conventional LPE or MOCVD techniques. This incorporated layer now functions as a precise etching mask for material selective etchants, such as HCl. Thereafter, as is shown in FIG. 7 at 708, a layer of blocking material, InP, is deposited by metal-organic chemical vapor deposition (MOCVD) or grown by liquid phase epitaxy (LPE).

Figure 7:
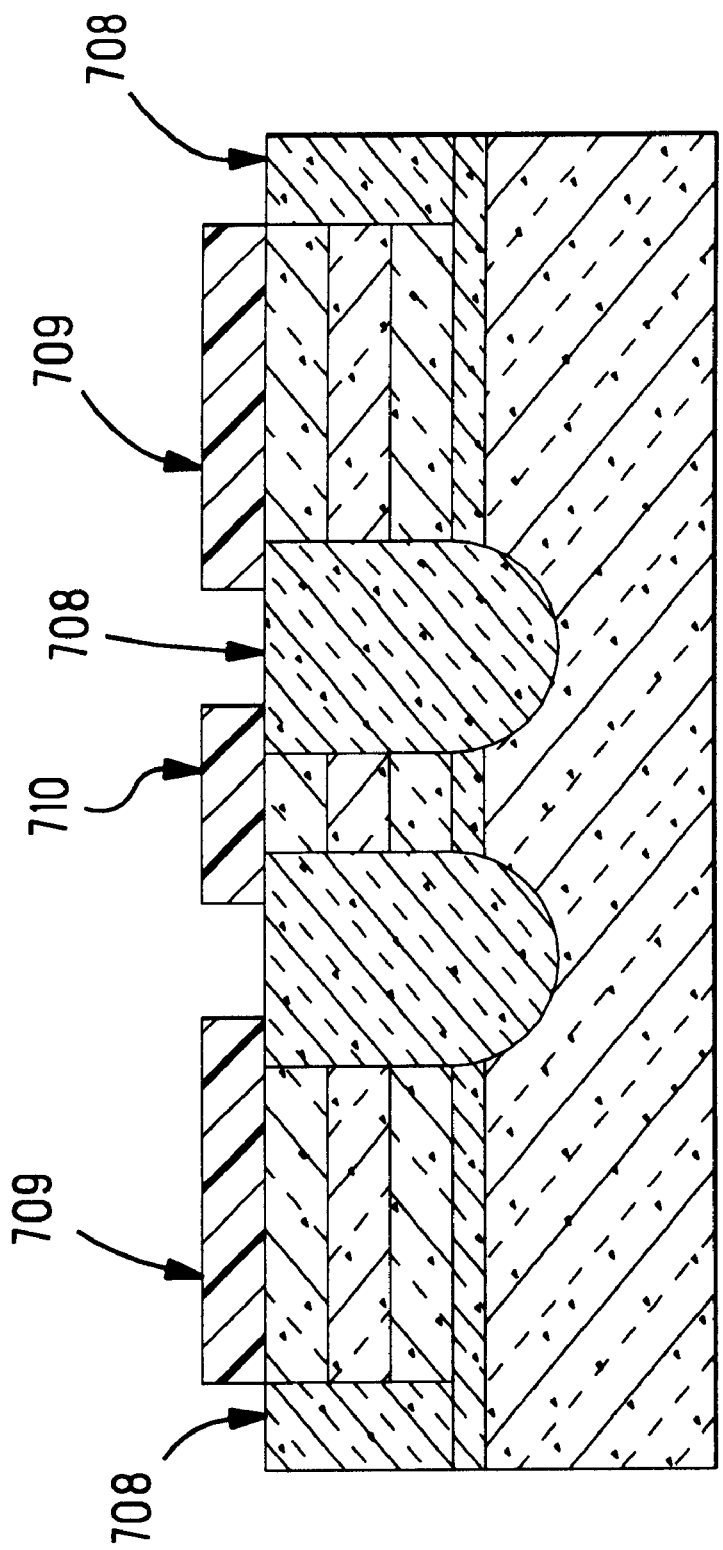
Figure 8:
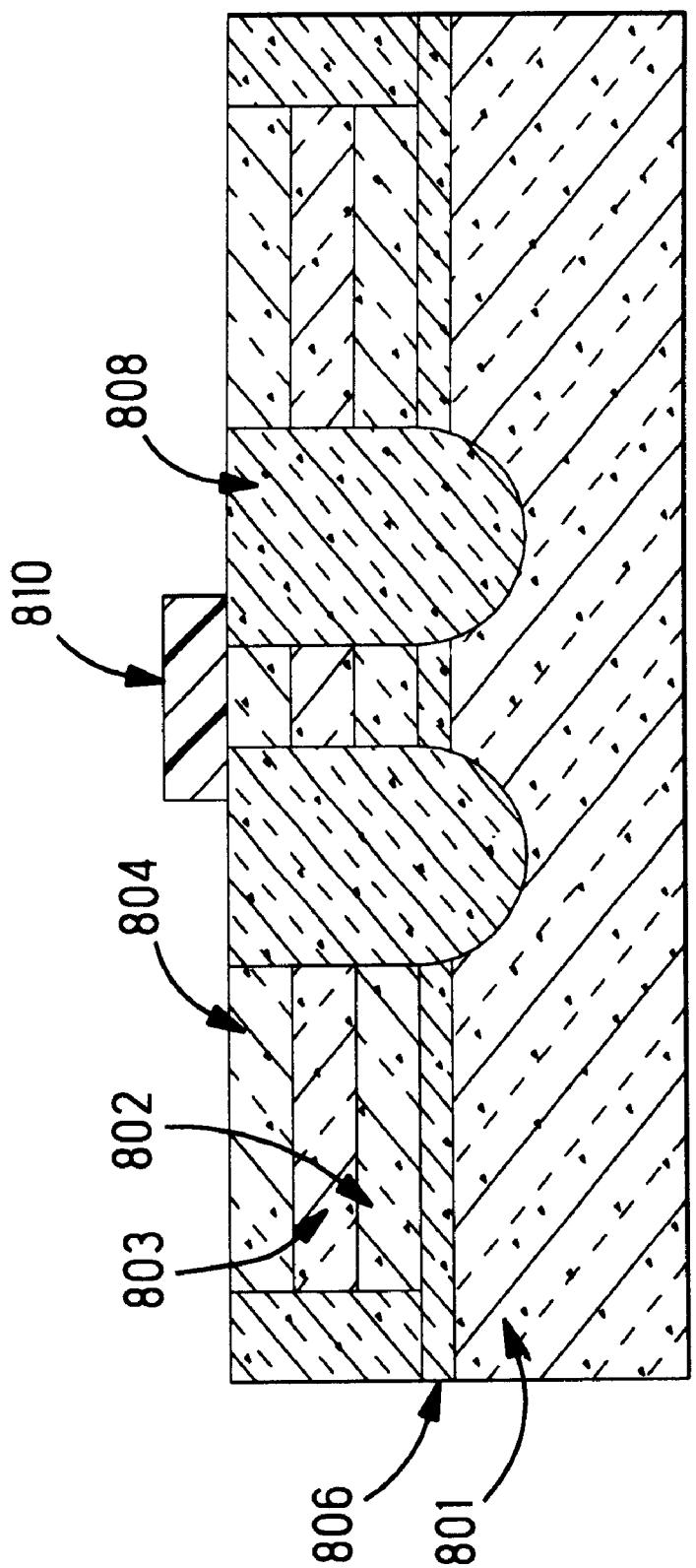
Figure 9:
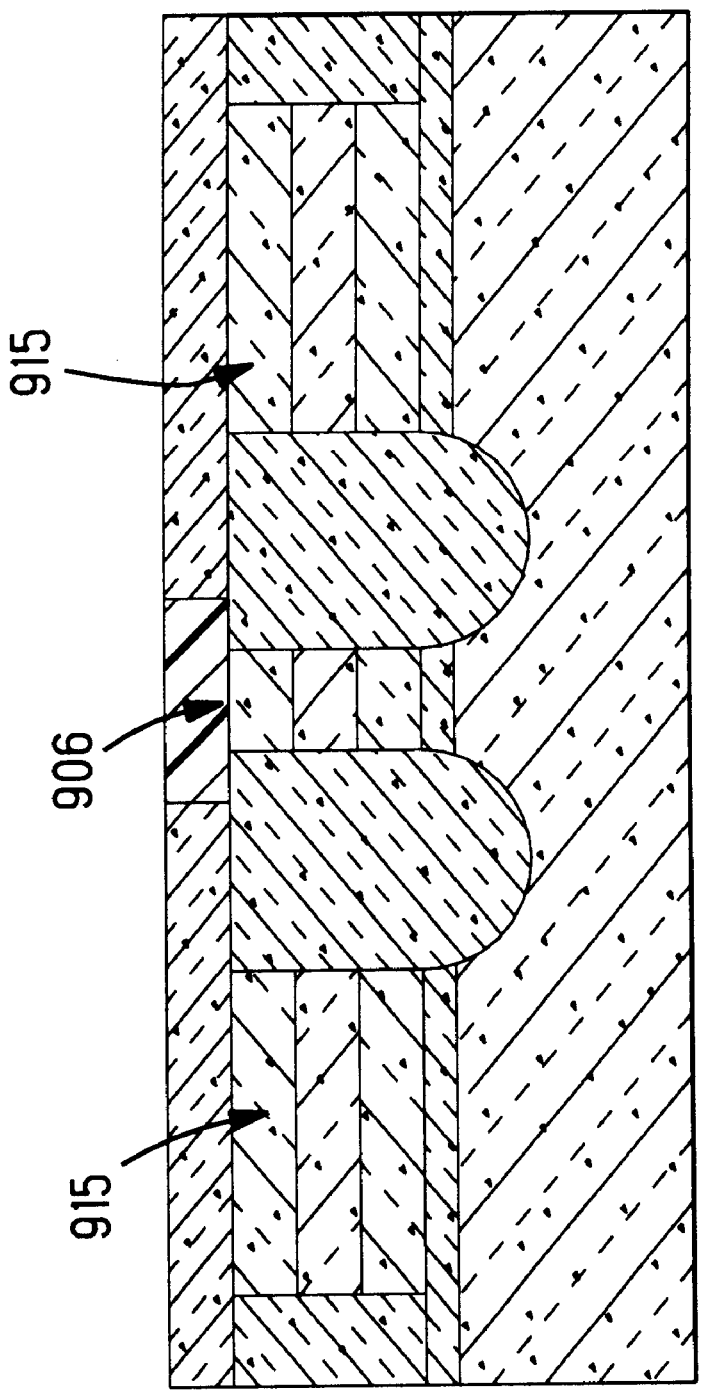

If MOCVD is used, a dielectric mask is utilized as is shown at 709 in FIG. 7. With the dielectric 709 as the mask, the MOCVD technique produces a nearly planarized InP blocking layer at 708. The InP blocking layers may contain p-type InP, for example if zinc is used as a dopant; n-type InP, for example if sulfur is used as the dopant; and/or semi-insulating InP, for example if the dopant is iron. To this end, multiple combinations of any of these three types of InP can, in fact, be used. These are shown as the blocking layers, and are effected in the first regrowth. By using a photoresist to protect the dielectric in the central portion of the chip, shown at 710, the dielectric shown at 709 on the sides of the chip are etched selectively from the surface. The resulting structure is as shown in FIG. 8 with the dielectric material shown at 810, the substrate at 801 the buffer laer, the InP buffer layer at 806, the active layer at 802, the cladding layer at 803, the etch stop alignment layer at 804, the InP blocking layer at 808 and which correspond to the various layers in previous drawing figures.

Figure 10:
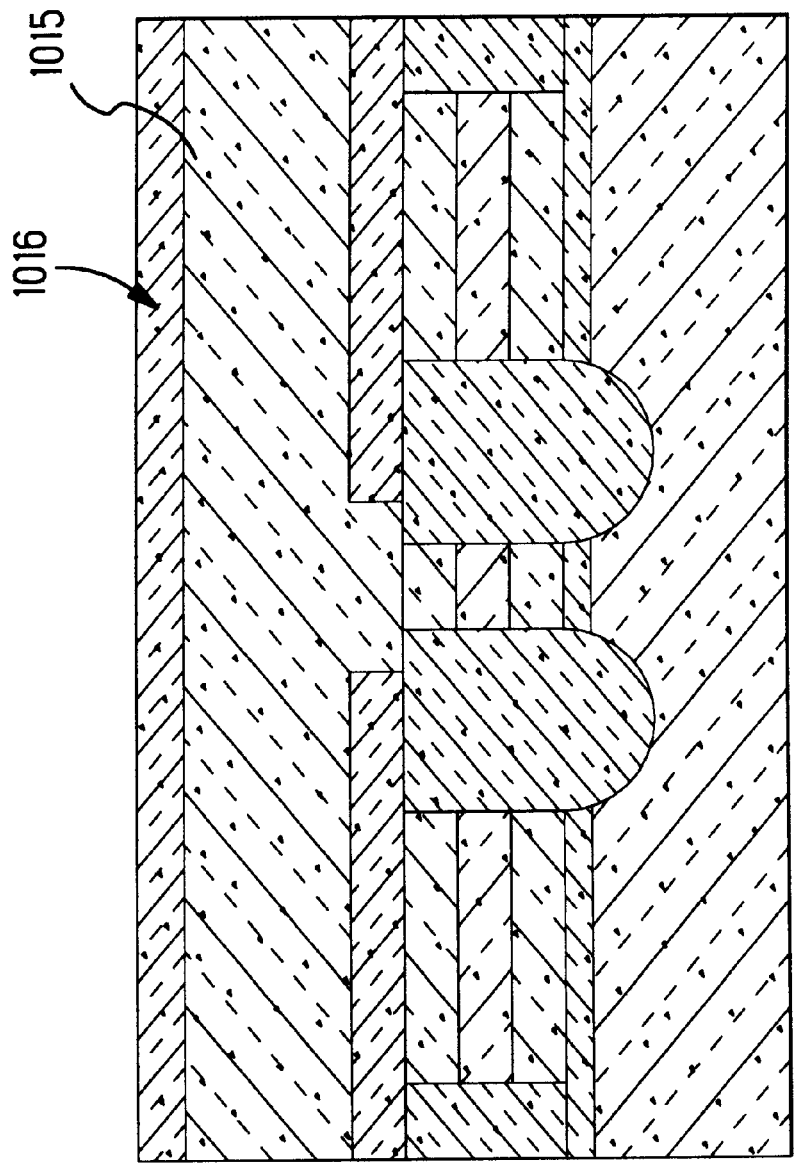
Figure 11:
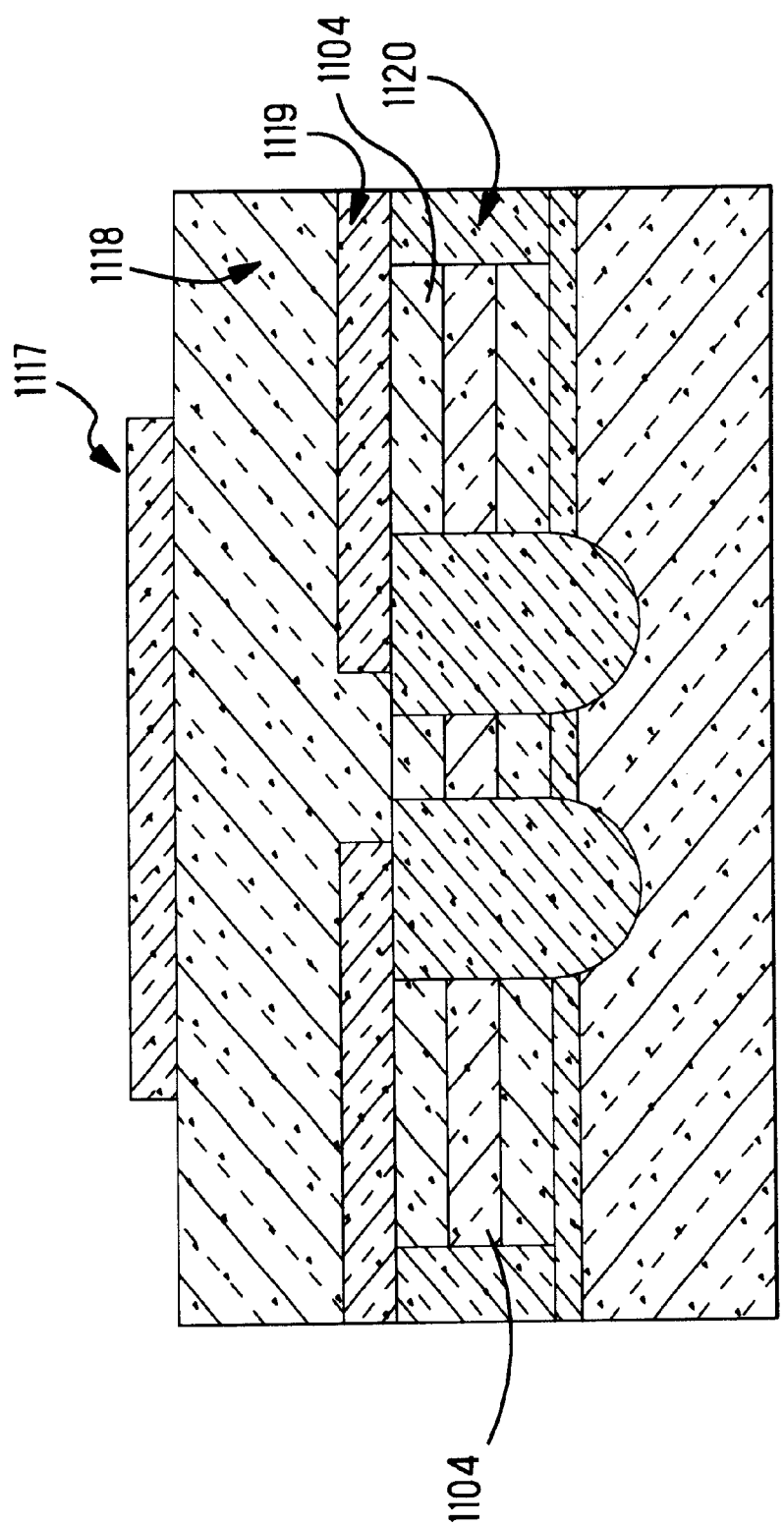
Figure 12:
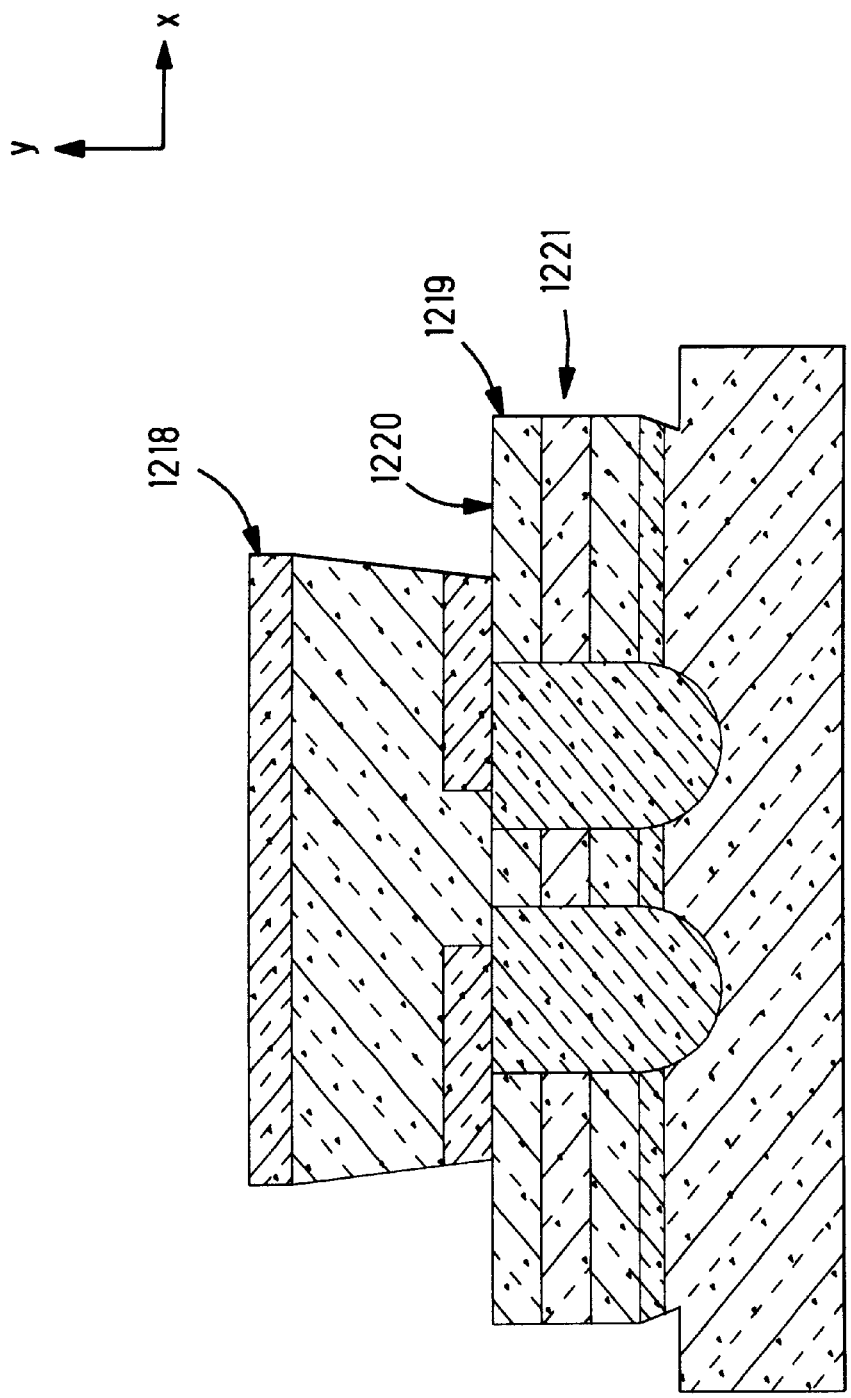
FIG. 12 is a cross sectional view of the buried heterostructure laser with the alignment notch of the present disclosure.
Figure 13:
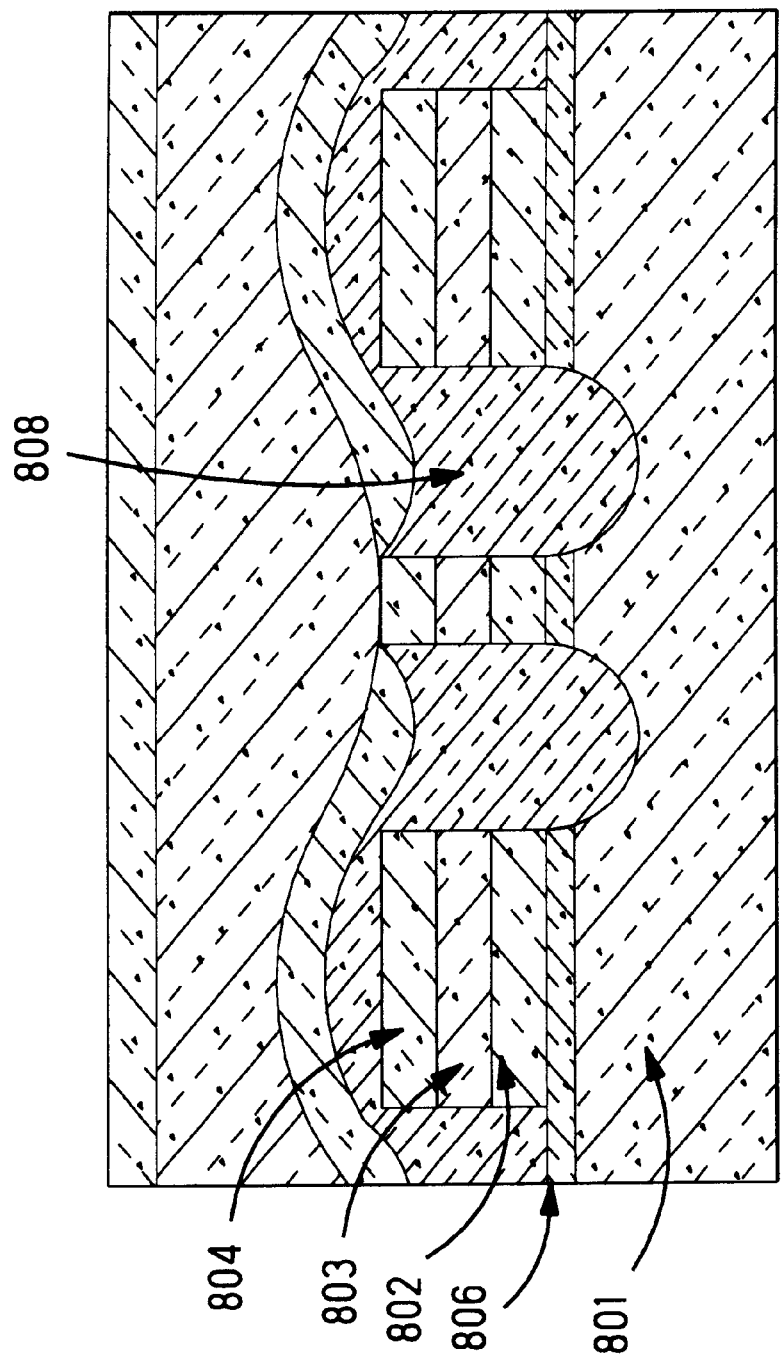
FIGS. 13–15 show the processing steps to effect an alternative embodiment of the invention of the present disclosure.
Figure 14:
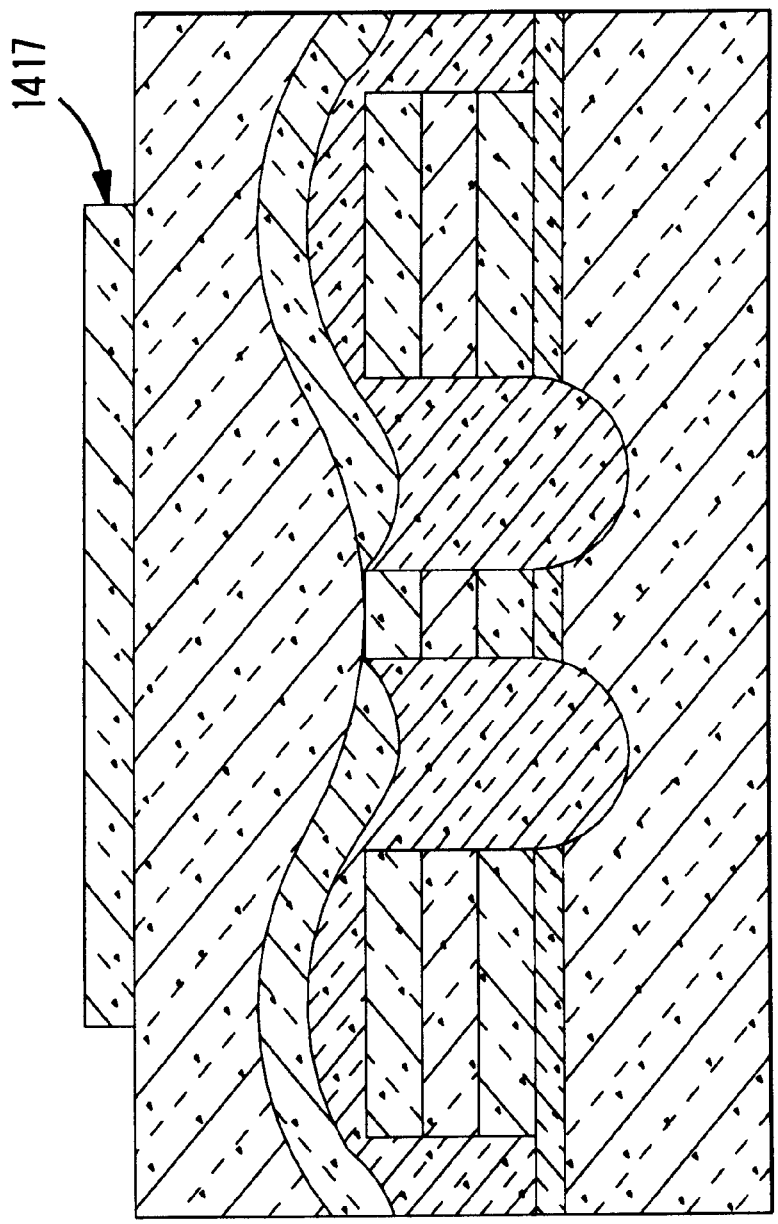
Figure 15:
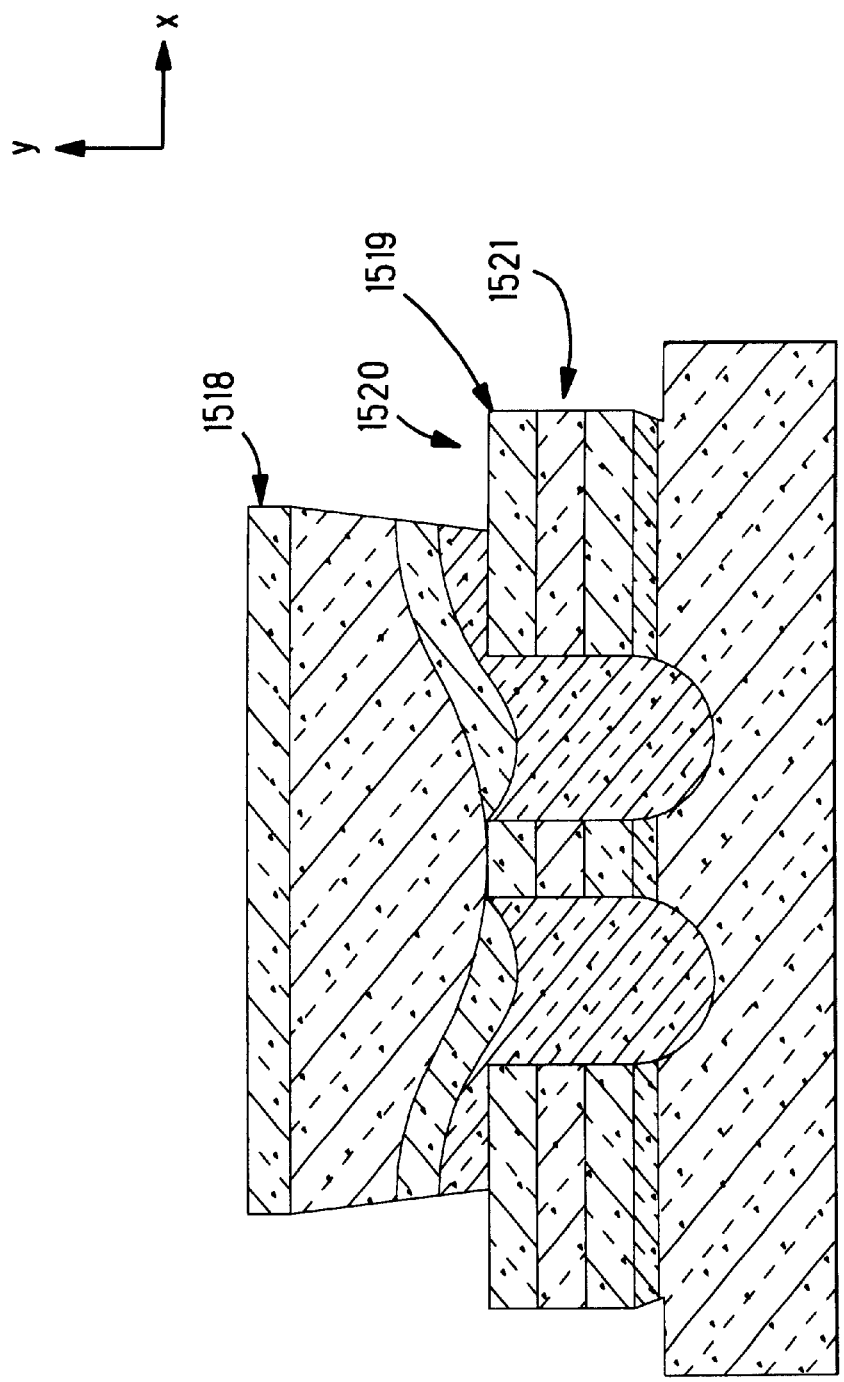

After the first blocking layer regrowth is complete, a second InP blocking layer is deposited. In the present discussion, LPE or MOCVD is utilized to effect this deposition. In addition, as before, the second InP blocking layer can be p-type, n-type or semi-insulating InP or any multiple combinations of these three types of InP. This second layer of blocking material is used to block current flow between the side sections shown at 915 in FIG. 9 and the central mesa shown at 906. Furthermore, after the dielectric layer which covers the mesa 906 is removed, the p-type InP burying layer is deposited by MOCVD or grown by LPE techniques. Either of these techniques can thereafter be used to effect the growth or deposition of the InGaAsP p-contact layer. The p-type burying layer is shown at 1015 and the p-type contact layer is shown as 1016 in FIG. 10. Finally, in order to reveal the alignment notch for effecting the alignment between the silicon pedestals and standoffs on a silicon waferboard (not shown), the contact layer 1016 In FIG. 10 is partially etched as is shown in FIG. 11. This is shown at 1117. Using a solution of hydrochloric acid, for example hydrochloric acid and water or a mixture of hydrochloric acid and phosphoric acid, the etch stop alignment layers 1104 are both revealed by etching the InP burying layer and the InP blocking layers. This is as shown in FIG. 12 with the etching revealing notches 1218 and 1219. The first surface 1220 is for alignment in the y direction to a standoff, while the side surface 1221 is for registration in the x-direction shown in FIG. 12 to a pedestal. In this etching step to reveal surfaces 1220 and the notch 1219, selective etching is used whereby the InP is etched. To this end, both the InP burying layer shown at 1118, the second regrowth InP layer shown at 1119 and the side layer of InP 1120 effected in the first regrowth are selectively etched. This reveals the first surface 1220, which receives the standoff for y-direction registration as is shown in FIG. 12. Additionally, the notch along the side referenced as 1219 in FIG. 12 is effected in this etch step. The side surface 1221 is used for the registration in the x-direction to a pedestal, In the technique where LPE is used to grow the InP layers, the basic techniques used up to the step shown in FIG. 6 are carried out, With the structure shown in FIG. 6, the photoresist and dielectric, shown as 606 and 605, respectively, are removed. LPE is thereafter used to regrow p-type InP blocking layer, the n-type InP blocking layer and the p-type InP burying layer. Additionally, the p-type contact layers of InGaAs are also grown by LPE. The final structure after LPE is used to grow InP as well as the contact layers is as shown in FIG. 13. Thereafter, a portion of the InGaAs contact layer is removed as is shown in FIG. 14 at 1417. Thereafter, using a solution of HCl which could be, again, HCl and water or HCl and $H_3PO_4$, the Q-alignment layers are revealed. This is as shown in FIG. 15. Again, as shown in FIG. 15, a first surface 1520 is revealed and enables the alignment in the y-direction as is shown in FIG. 15. Furthermore, as is shown in FIG. 15, the side surface 1521 and the alignment notch 1519 as well as the region 1518 are revealed through this second etching step which etches the InP, but does not etch the InGaAsP layers.

By virtue of the fact that the active and etch stop alignment layers are defined at the same time by very precise photolithographic patterning and etching techniques to submicron accuracy, the accuracy in the x- and y-directions by the invention of the present disclosure allows the edge emitting buried laser chips to be passively aligned to a single mode optical fiber, disposed on a silicon waferboard.

We claim:

1. An edge emitting laser, comprising:

a substrate with or without a buffer layer having a central mesa disposed thereon, said central mesa having a bottom surface, a top surface and side surfaces and said mesa having an active layer disposed on said substrate with or without a buffer layer, a cladding layer disposed on said active layer, and a quaternary layer disposed on said cladding layer;

first and second blocking layers disposed along said sides of said mesa; and at least one alignment fiducial disposed along an outer region of the laser, said alignment fiducial comprising at least a first surface and a second surface, said first surface being a certain distance from said active layer in the y-direction and said second surface being a certain distance from the center of said active layer in the x-direction, said first surface comprising at least a portion of the top of said quaternary layer, said second surface comprising at least a portion of a side of at least one of said quaternary, cladding, or active layers.

2. A laser as recited in claim 1, wherein said notch further comprises a first layer of quaternary material, a layer of InP and a second layer of quaternary material.

3. A laser as recited in claim 2, wherein said first alignment surface is along a top surface of said second layer of quaternary material and said second alignment surface is along side surfaces of said first layer of quaternary material, said layer of InP and said second layer of quaternary material.

4. A laser as recited in claim 1, further comprising a burying layer disposed on top of said top surface of said mesa and a second blocking layer disposed on top of said first blocking layer and said top surface of said alignment notch.

5. A laser as recited in claim 2, wherein said active layer and said layers of quaternary material are InGaAsP or multiple quantum wells composed by InGaAsP material.

6. An edge emitting laser, comprising:

a central mesa and a side mesa, said central mesa emitting light therefrom, and said central mesa and said side mesa having a first quaternary layer, a cladding layer disposed on said first quaternary layer and a second quaternary layer disposed on said cladding layer;

a first blocking layer disposed between said central mesa and said side mesa;

a burying layer disposed on a top surface of said central mesa;

a second blocking layer disposed on a top surface of said first blocking layer and a top surface of said second quaternary layer of said side mesa;

and an alignment fiducial having a first alignment surface along at least a portion of said top surface of said second quaternary layer of said side mesa, and a second alignment surface along at least a portion of a side surface of at least one of said first quaternary, said cladding or said second quaternary layers of said side mesa, wherein said first alignment surface and second alignment surfaces form said alignment fiducial.

7. A laser as recited in claim 6, wherein said first and second quaternary layers are InGaAsP or multiple quantum wells composed by InGaAsP material.

8. A laser as recited in claim 6, wherein said first and second blocking layers are InP with n-type, p-type and semi-insulating doping.

9. An edge emitting laser, comprising:

a central mesa and a side mesa disposed on a substrate, said central mesa emitting light therefrom, and said central mesa and said side mesa having a first quaternary layer, a cladding layer disposed on said first quaternary layer and a second quaternary layer disposed on said cladding layer;

a blocking layer disposed between said central mesa and said side mesa;

and an alignment fiducial, said alignment fiducial having a first surface along at least a portion of the top of said second quaternary layer of said side mesa and a second alignment surface along at least a portion of a side surface of at least one of said first quaternary, said cladding or said second quaternary layers of said side mesa, wherein said first alignment surface and second alignment surfaces form said alignment fiducial.

10. A laser as recited in claim 9, further comprising another blocking layer disposed on a top surface of said blocking layer and on said top surface of said second quaternary layer of said side mesa.

11. A laser as recited in claim 9, wherein said quaternary layers are InGaAsP and said cladding layers and said substrate are InP.

12. A laser as recited in claim 10, wherein said blocking layers are InP with n-type, p-type and semi-insulating doping.

* * * * *